US005543796A

United States Patent [19]

Thomas et al.

[11] Patent Number: 5,543,796

[45] Date of Patent: Aug. 6, 1996

[54] BROADBAND MICROWAVE ABSORBER

[75] Inventors: Gerald F. Thomas, Arlington; James A. Hoffner, Mansfield, both of Tex.

[73] Assignee: Loral Vought Systems Corporation, Grand Prairie, Tex.

[21] Appl. No.: 417,604

[22] Filed: Sep. 13, 1982

[51] Int. Cl.$^{6}$ .......... H01L 17/00

[52] U.S. Cl. .......... 342/4; 342/1

[58] Field of Search .......... 343/18 A; 342/782, 342/1, 4

[56] References Cited

U.S. PATENT DOCUMENTS

| | | | |
|---|---|---|---|
| 2,527,918 | 10/1950 | Collard | 343/18 A |
| 2,992,425 | 7/1961 | Pratt | 343/18 A |
| 3,315,261 | 4/1967 | Wesch | 343/18 A |
| 4,118,704 | 10/1978 | Ishino et al. | 343/18 A |
| 4,381,510 | 4/1983 | Wren | 343/18 A |

*Primary Examiner*—Gilberto Barron, Jr.
*Attorney, Agent, or Firm*—Richards, Medlock & Andrews

[57] ABSTRACT

A broadband absorber for absorbing a broad spectrum of incident microwave radiation is provided comprising a plurality of strips of inductive absorbing material having magnetic particles dispersed throughout an organic binder; the width, thickness, and composition of the strips being selected such that each strip absorbs a specific region of the microwave spectrum. The plurality of strips of absorbing material are supported by a substrate that is electrically conductive to microwave radiation. The substrate has a plurality of grooves and ridges in a repeating pattern, the grooves being of varying depths. A facing sheet, electrically transparent to microwave radiation, is provided for coupling the incident microwave radiation to the plurality of strips of inductive absorbing material.

8 Claims, 1 Drawing Sheet

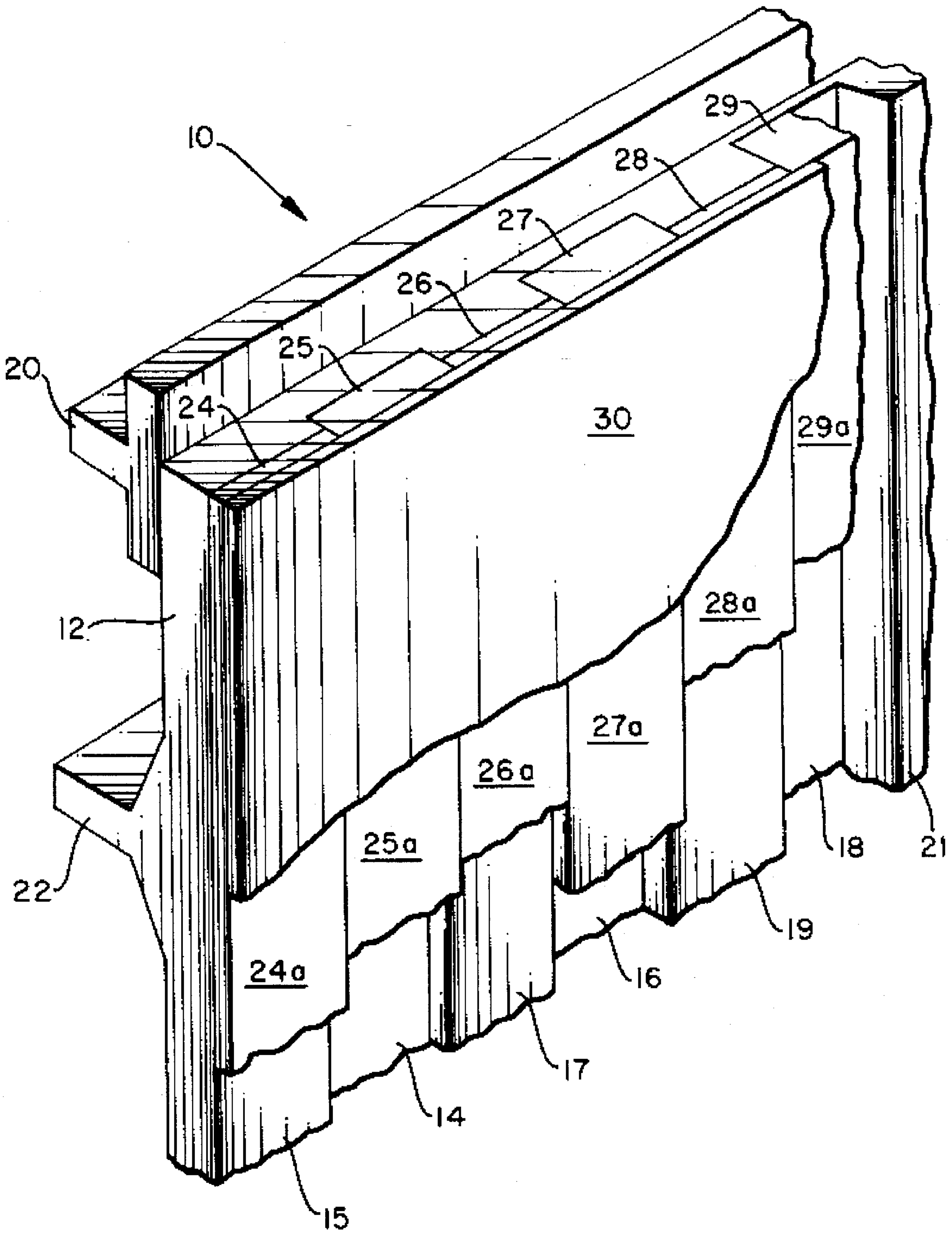
10
20
24
25
26
27
28
29
30
29a
28a
27a
26a
25a
24a
12
22
21
18
19
16
17
14
15

BROADBAND MICROWAVE ABSORBER

TECHNICAL FIELD

The present invention relates to structures and material for absorbing electromagnetic radiation, and more specifically, to an improved broadband microwave for absorbing a broad spectrum of incident microwave radiation.

BACKGROUND OF THE INVENTION

Microwave absorbing structures capable of reducing the reflection of microwave radiation are well known in the prior art. These structures are typically applied to a reflecting surface for the purpose of shielding the surface from radio-echo detecting devices. Heretofore, absorbing structures have incorporated electrically conductive or ferromagnetic flakes dispersed throughout an organic binder to provide absorption. Such a structure is described in U.S. Pat. No. 2,954,552 to Halpern. Moreover, microwave absorbers for broadband applications have also been disclosed as described in U.S. Pat. No. 4,023,174 to Wright. In particular, Wright discloses the use of thin slabs and pyramidal structures formed of mixed ferrite compositions to accomplish broadband absorption. Mixed ferrites are crystal type compounds of a spinel structure having a formula of $(MO)Fe_2O_3$, where MO stands for more than one bivalent metal oxide in the crystal structure. The dielectric constant and magnetic permeability of these mixed ferrites vary in such a manner that the absorber remains resonant over a wide range of frequencies, thus providing broadband absorption. It is also known to provide a broadband absorber having a plurality of mixed ferrite plates arranged at spaced-apart intervals instead of the slab or pyramid structures disclosed in Wright. This structure is described in the patent to Ishino et al., U.S. Pat. No. 4,118,704. In this patent, the particular thickness of each of the ferrite plates is a function of the spacing between the plates such that the overall response of the structure is equivalent to the response of a ferrite slab structure. The above-described absorber structures have proven adequate for some applications but there is a present need for an absorber with greater broadband response.

SUMMARY OF THE INVENTION

The present invention provides an improved absorber for absorbing a broad spectrum of incident microwave radiation. The absorber comprises a plurality of strips of inductive absorbing material, and a substrate electrically conductive to microwaves for supporting the plurality of strips of inductive absorbing material. The substrate has a plurality of grooves and ridges in a repeating pattern, the grooves being of varying depths. A facing sheet electrically transparent to microwaves is provided for coupling the incident microwave radiation to the plurality of absorbing strips.

In one embodiment of the invention, the strips of inductive absorbing material have magnetic particles dispersed throughout an organic binder. The magnetic particles in the inductive absorbing strips preferably consist of hexagonal and/or spinel ferrites, i.e., ferrites with tetravalent and/or bivalent ions substituted for a portion of the iron.

In accordance with the present invention, the plurality of strips of inductive absorbing material have predetermined widths, thicknesses, and compositions such that each strip absorbs a specific region of the microwave spectrum, thus providing broadband absorption of the incident microwave radiation. As noted above, the substrate has a repeating pattern of ridges and grooves of differing depths the plurality of strips. Once the strips have been affixed to the substrate, the outer peripheral surfaces thereof form a continuous plane so as to provide a smooth mounting surface for the facing sheet. This structure thus presents a stepless, seamless surface to incident electromagnetic radiation, allowing the absorber to be used in hostile gas flow environments.

BRIEF DESCRIPTION OF THE DRAWING

The FIGURE shows a perspective view partly in cross-section of the broadband microwave absorbing structure of the present invention.

DETAILED DESCRIPTION OF THE INVENTION

Referring now to the FIGURE, the microwave absorbing structure of the present invention is shown in detail. In particular, the absorber 10 comprises a structural composite substrate 12 electrically conductive to microwaves, having a plurality of grooves 14, 16 and 18, and a plurality of ridges 15, 17, 19 and 21. The grooves 14, 16 and 18 have varying depths as shown in the FIGURE. The outer peripheral surfaces of the ridges 15, 17, 19 and 21, however, form a discontinuous planar surface. It should be appreciated that the FIGURE shows only a portion of the absorber 10, the pattern of ridges and grooves preferably being repeated over the entire length of the absorber such that the structure responds uniformly to the broadband incident radiation. The substrate 12 may be attached to, or supported by, a separate structure by means of a preformed substructure 20 or an integrally formed substructure 22. In accordance with the present invention, the grooves 14, 16 and 18, and the ridges 15, 17, 19 and 21, are utilized to support a plurality of strips 24–29 of inductive absorbing material which absorbs the incident microwave radiation. As seen in the FIGURE, several of these strips have varying thicknesses so they can be securely mounted in the grooves of the substrate 12. For example, the thickness of strip 27 is equal to the depth of groove 16. Similarly, the thickness of strip 29 is equal to the depth of groove 18. The strips 24, 26 and 28, however, all have the same thickness.

The outer peripheral surfaces **24*a*–29*a* of the inductive absorbing strips 24–29 form a continuous planar surface to provide a smooth surface for an outer facing sheet 30, electrically transparent to microwaves, of fibrous reinforcing material. This material may be formed of any fabric that produces a composite with a relative permittivity which optimizes the coupling of the incident radiation with the underlying inductive absorbing strips 24–29. The outer facing sheet 30**, being a continuous, unbroken planar surface, allows the absorber to be utilized in hostile environments, such as where microwave energy in a high velocity gas flow is required to be absorbed.

As noted above, the substrate 12 has a pattern of ridges and grooves, this pattern being repeated over preferably the entire length of the absorber 10. This unique structure provides for absorption of a broad spectrum of incident microwave radiation. In particular, the width, thickness, and composition of the inductive absorbing strips 24–29 are selected during the design of the structure such that each strip absorbs a specific region of the microwave spectrum. For example, it is known that the resonant absorption frequency of a strip of absorption material is a function of the thickness thereof. In particular, where T is the physical thickness of the material and n the index of refraction thereof, then maximum absorption occurs when nT equals odd multiples of the one-quarter wavelength of the incident radiation, measured inside the strip. Therefore, if the same composition is used in the absorbing strips, multiband response can be achieved by providing strips of different thickness. Similarly, even when the thicknesses of the absorbing strips are identical, the frequency response of each strip can be varied by utilizing different compositions to form the absorbing material.

In accordance with these observations, the thickness or composition of the strips 24–29 is selected to achieve the desired broadband frequency response of the absorber. The varying-depth strips, such as strips 27 and 29, are then affixed by any suitable method into the corresponding grooves 16 and 18. The strips 24, 26 and 28 which have equal thickness but may have different compositions and thus different frequency responses, are affixed to the ridges 15, 17 and 19 in a similar manner. The outer peripheral surfaces 24*a*–29*a* of the absorbing strips are then covered by the outer facing sheet 30 to provide a stepless, seamless absorbing surface. It should be appreciated that, although the FIGURE does not so provide, the strips 24–29 may also have varying widths to provide further control of the frequency ranges to be absorbed.

Each of the absorbing strips 24–29 of the present invention has magnetic particles dispersed throughout an organic binder. In the preferred embodiment, the magnetic particles will typically consist of hexagonal and/or spinel ferrites. The term ferrite is commonly used as a generic term describing a class of magnetic oxide components that contain iron oxide ($Fe_2O_3$) as a major component. More specifically, there are several crystal structure classes of compounds loosely defined as ferrites, such as spinel and hexagonal ferrites. The hexagonal ferrites are a group of ferromagnetic oxides in which the principal component is iron oxide in combination with a bivalent oxide (BaO, SrO or PbO) and a bivalent transition metal oxide. An example of a hexagonal ferrite is magnetobarite, $BaFe_{12}O_{19}$. The spinel ferrites are a group of ferromagnetic oxides in which the principal component is iron oxide in combination with a bivalent metal oxide. Spinel ferrites usually have bivalent ions substituted for a portion of the iron structure.

In accordance with the present invention, the plurality of strips 24–29 of inductive absorbing material include magnetic particles of hexagonal and/or spinel ferrites, i.e., ferrites having tetravalent and/or bivalent ions substituted for a portion of the iron. These magnetic particles are dispersed throughout an organic, elastomeric or plastic binder. In particular, the elastomeric binder is typically polyurethane for low-temperature (175° C.) applications. Higher temperature resistance requires the use of a silicon elastomer (300° C.) or a polyimide resin (430° C.).

Referring back to the FIGURE, the outer facing sheet 30 is preferably formed of a fibrous reinforcing material, such as an eight to five harness satin weave comprised of aluminasilica ceramic fibers in a resin binder. The resin binder may be an epoxide polymer combined with a curing agent such as metaphenylene diamine. Other unfilled resin systems can also be advantageously utilized to adjust the relative permittivity of the sheet 30 for maximum effectiveness. The thickness of the outer facing sheet 30 will depend on the frequency ranges being absorbed, but typically will be on the order of 0.1 to 0.3 millimeters.

The substrate 12 is preferably a carbonaceous composite consisting of a graphite fiber lattice bonded by pyrolyzed phenolic resins and densified by impregnation with additional phenolic resins. It should be appreciated that any other composite material electrically conductive to microwaves and capable of enhancing the dissipation of the incident microwave energy could also be utilized.

It can be seen that the present invention provides for an improved broadband absorber for absorbing a broad spectrum of incident microwave radiation. In particular, the plurality of strips of inductive absorbing material have different widths, thicknesses and compositions such that each strip absorbs a specific region of the microwave spectrum. The strips are mounted in a substrate having a repeated pattern of ridges and varying depth grooves such that the structure responds uniformly to the broadband incident radiation over its entire length.

Although the invention has been described and illustrated in detail, it is to be clearly understood that the same is by way of illustration and example only and is not to be taken by way of limitation. The spirit and scope of the subject invention are to be limited only by the terms of the appended claims.

We claim:

1. A broadband absorber for absorbing a broad spectrum of incident microwave radiation, comprising:

a first plurality of stripes of inductive absorbing material having magnetic particles dispersed throughout an organic binder, the width, thickness, and composition of the strips being selected such that each strip absorbs a specific region of the microwave spectrum;

a substrate electrically conductive to microwave radiation, the substrate having a plurality of grooves and ridges in a repeating pattern, the grooves being of varying depths and comprising means for supporting said first plurality of strips of inductive absorbing material; and a second plurality of strips of inductive absorbing material, the strips of the second plurality of strips extending along the substrate ridges, parallel with and between the strip of said first plurality of strips, said ridges comprises means for supporting said second plurality of strips of inductive absorbing material.

2. The broadband absorber as defined in claim 1 further including a facing sheet covering the strips of said first and second pluralities of strips and electrically transparent to microwave radiation for coupling the incident microwave radiation to the first and second pluralities of strips of inductive absorbing material.

3. The broadband absorber as defined in claim 1, wherein each of the inductive absorbing strips has an outer peripheral surface, the outer peripheral surfaces of the pluralities of inductive absorbing strips forming a continuous planar surface when the strips are mounted on the substrate.

4. The broadband absorber as defined in claim 3, wherein a facing sheet is mounted on the continuous planar surface to provide a step-less, seam-less surface to incident microwave radiation.

5. The broadband absorber as defined in claim 1 wherein the magnetic particles in the inductive absorbing strips are selected from the group consisting of ferrites with bivalent ions substituted for a portion of the iron, and mixtures thereof.

6. The broadband absorber as defined in claim 1, wherein the strips of said second plurality of strips of inductive absorbing material are of equal thickness.

7. The broadband absorber as defined in claim 1, wherein the strips of said second plurality of strips of inductive absorbing material are thinner than the strips of said first plurality of strips.

8. The broadband absorber as defined in claim 1, wherein said substrate comprises a non-metallic structure having a conductive matrix of carbonized resin.

* * * * *